United States Patent
St. Amand et al.

(10) Patent No.: US 8,836,115 B1
(45) Date of Patent: Sep. 16, 2014

(54) STACKED INVERTED FLIP CHIP PACKAGE AND FABRICATION METHOD

(75) Inventors: Roger D. St. Amand, Tempe, AZ (US); August Joseph Miller, Jr., Queen Creek, AZ (US); Alexander William Copia, Chandler, AZ (US); KwangSeok Oh, Gyeonggi-do (KR)

(73) Assignee: Amkor Technology, Inc.

( * ) Notice: Subject to any disclaimer, the term of this patent is extended or adjusted under 35 U.S.C. 154(b) by 548 days.

(21) Appl. No.: 12/183,778

(22) Filed: Jul. 31, 2008

(51) Int. Cl.
*H01L 23/48* (2006.01)

(52) U.S. Cl.
USPC ............ 257/737; 257/E21.511; 257/E23.068; 438/108

(58) Field of Classification Search
USPC ............ 257/737, E21.511, E23.068; 438/108
See application file for complete search history.

(56) References Cited

U.S. PATENT DOCUMENTS

| | | | |
|---|---|---|---|
| 5,608,262 A | 3/1997 | Degani et al. | 257/723 |
| 6,084,308 A * | 7/2000 | Kelkar et al. | 257/777 |
| 6,642,610 B2 | 11/2003 | Park et al. | 257/678 |
| 6,825,567 B1 | 11/2004 | Wang et al. | 257/777 |
| 2003/0110624 A1* | 6/2003 | Rumsey et al. | 29/840 |
| 2003/0183944 A1* | 10/2003 | Taniguchi | 257/777 |
| 2004/0046263 A1* | 3/2004 | Harper et al. | 257/777 |
| 2004/0217485 A1* | 11/2004 | Chung | 257/778 |
| 2005/0127492 A1* | 6/2005 | Howard et al. | 257/691 |
| 2006/0065972 A1* | 3/2006 | Khan et al. | 257/712 |
| 2007/0069371 A1* | 3/2007 | Iksan et al. | 257/706 |

\* cited by examiner

*Primary Examiner* — Marvin Payen
(74) *Attorney, Agent, or Firm* — McAndrews, Held & Malloy, Ltd.

(57) ABSTRACT

A stacked inverted flip chip package includes a substrate having a secondary electronic component opening and first traces. Primary flip chip bumps electrically and physically couple a primary electronic component structure to the substrate. Secondary flip chip bumps electrically and physically couple an inverted secondary electronic component to the primary electronic component structure between the primary electronic component structure and the substrate and within the secondary electronic component opening. By placing the secondary electronic component between the primary electronic component structure and the substrate, the height of the stacked inverted flip chip package is minimized.

13 Claims, 8 Drawing Sheets

STACKED INVERTED FLIP CHIP PACKAGE AND FABRICATION METHOD

BACKGROUND OF THE INVENTION

1. Field of the Invention

The present application relates to the field of electronics, and more particularly, to methods of forming flip chip packages and related structures.

2. Description of the Related Art

In a stacked package, a first die is typically mounted to a substrate and a second die is mounted to the first die. Although reducing the footprint as compared to mounting the first and second dies in a side by side arrangement, the stacking of the second die on the first die increases the overall height of the stacked package.

SUMMARY OF THE INVENTION

A stacked inverted flip chip package includes a substrate having a secondary electronic component opening and first traces. Primary flip chip bumps electrically and physically couple a primary electronic component structure to the substrate. Secondary flip chip bumps electrically and physically couple an inverted secondary electronic component to the primary electronic component structure between the primary electronic component structure and the substrate and within the secondary electronic component opening of the substrate. By placing the secondary electronic component between the primary electronic component structure and the substrate, the height of the stacked inverted flip chip package is minimized.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
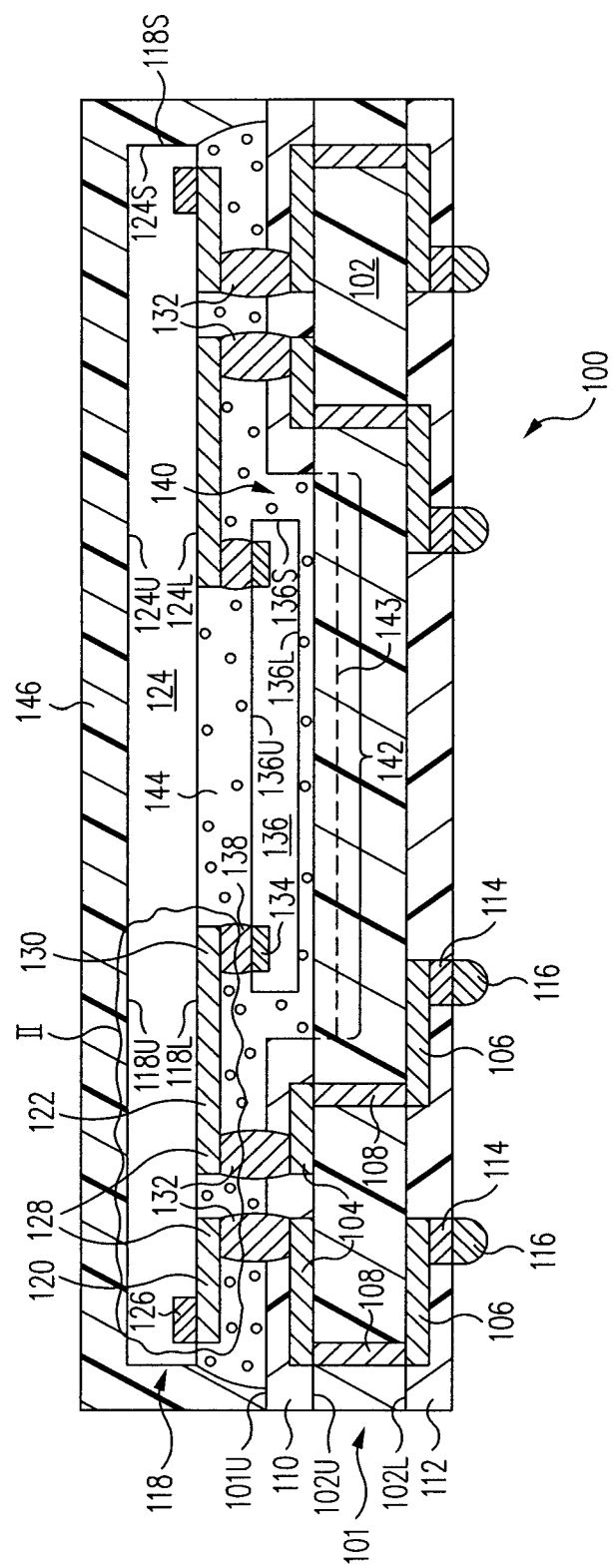
FIG. 1 is a cross-sectional view of a stacked inverted flip chip package in accordance with one embodiment.

Referring to FIG. 1, a stacked inverted flip chip package 100 includes a substrate 101 having a secondary electronic component opening 140 and first traces 104. Primary flip chip bumps 132 electrically and physically couple a primary electronic component structure 118 to substrate 101. Secondary flip chip bumps 138 electrically and physically couple an inverted secondary electronic component 136 to primary electronic component structure 118 between primary electronic component structure 118 and substrate 101 and within secondary electronic component opening 140. By placing secondary electronic component 136 between primary electronic component structure 118 and substrate 101, the height of stacked inverted flip chip package 100 is minimized.

More particularly, FIG. 1 is a cross-sectional view of a stacked inverted flip chip package 100 in accordance with one embodiment. Stacked inverted flip chip package 100 includes a substrate 101, e.g., formed of metal, with ceramic, pre-molded plastic or laminate material, although substrate 101 may be formed of other materials in other embodiments.

Substrate 101 is sometimes called a cavity substrate and includes a dielectric layer 102. Dielectric layer 102 includes an upper, e.g., first, surface 102U and a lower, e.g., second, surface 102L, opposite upper surface 102U.

Formed on upper surface 102U of dielectric layer 102 are a plurality of electrically conductive upper, e.g., first, traces 104. Formed on lower surface 102L of dielectric layer 102 are a plurality of electrically conductive lower, e.g., second, traces 106.

Extending through dielectric layer 102 from lower surface 102L to upper surface 102U are a plurality of electrically conductive vias 108. Lower traces 106 are electrically connected to upper traces 104 by vias 108.

Upper surface 102U of dielectric layer 102 has formed thereon an upper, e.g., first, solder mask 110, e.g., an epoxy based resin, sometimes called an insulative cover coat, through which electrically conductive bond fingers, e.g., the end portions, of upper traces 104 are exposed. Similarly, lower surface 102L of dielectric layer 102 has formed thereon a lower, e.g., second, solder mask 112, e.g., an epoxy based resin, sometimes called an insulative cover coat, through which pads 114 are exposed.

Formed on lower traces 106 are electrically conductive pads 114. Formed on pads 114 are electrically conductive interconnection balls 116, e.g., solder. Interconnection balls 116 are used to connect stacked inverted flip chip package 100 to a larger substrate such as a printed circuit mother board or another electronic component package.

Although a particular electrically conductive pathway between upper traces 104 and interconnection balls 116 is described above, other electrically conductive pathways can be formed. For example, contact metallizations can be formed between the various electrical conductors. Alternatively, pads 114 are not formed and interconnection balls 116 are formed directly on lower traces 106.

Further, instead of straight though vias 108, in one embodiment, substrate 101 is a multilayer laminate substrate and a plurality of vias and/or internal traces form the electrical interconnection between traces 104 and 106.

In yet another embodiment, interconnection balls 116 are distributed in an array format to form a ball grid array (BGA) type package. Alternatively, interconnection balls 116 are not formed, e.g., to form a metal land grid array (LGA) type package. In yet another alternative, pads 114/interconnection balls 116 are not formed, e.g., to form a leadless chip carrier (LCC) type package. In another embodiment, stacked inverted flip chip package 100 is inserted into a socket that is pre-mounted on the larger substrate, e.g., on the printed circuit mother board.

In another embodiment, a flex connector, sometimes called an edge connector or flex strip, is electrically connected to lower traces 106, e.g., for applications where stacked inverted flip chip package 100 is remote from the larger substrate. In light of this disclosure, those of skill in the art will understand that other electrically conductive pathway modifications can be used.

Referring still to FIG. 1, mounted, sometimes called flip chip attached, to substrate 101 is a primary electronic component structure 118. Primary electronic component structure 118 includes primary electronic component redistribution layer (RDL) traces 120, secondary electronic component RDL traces 122 and a primary electronic component 124.

Primary electronic component 124 includes a lower, e.g., first, surface 124L and an upper, e.g., second, surface 124U opposite lower surface 124L. Bond pads 126 of primary electronic component 124 are formed on lower surface 124L, sometimes called an active surface.

In accordance with this embodiment, primary electronic component 124 is a semiconductor die, sometimes called an upper semiconductor die, integrated circuit chip or an active component. However, in other embodiments, primary electronic component 124 is another type of electronic component such as a passive component, e.g., a resistor, capacitor or inductor.

Primary electronic component RDL traces 120 are formed on lower surface 124L of primary electronic component 124 and are electrically connected to bond pads 126 of primary electronic component 124. Primary electronic component RDL traces 120 define substrate terminals 128, sometimes called lands, of primary electronic component structure 118. More particular, first end portions of primary electronic component RDL traces 120 are directly attached to bond pads 126 of primary electronic component 124. Second end portions of primary electronic component RDL traces 120 form substrate terminals 128.

Generally, primary electronic component RDL traces 120 redistribute the pattern of bond pads 126 to the pattern of substrate terminals 128. In one embodiment, bond pads 126 are formed directly adjacent sides 124S of primary electronic component 124 in a wirebond pattern. In contrast, substrate terminals 128 are distributed in an array facilitating formation of flip chip interconnection therewith as discussed further below.

Secondary electronic component RDL traces 122 are also formed on lower surface 124L of primary electronic component 124. Secondary electronic component RDL traces 122 define secondary electronic component terminals 130 and substrate terminals 128 of primary electronic component structure 118. More particular, first end portions of secondary electronic component RDL traces 122 form secondary electronic component terminals 130, sometimes called lands. Second end portions of secondary electronic component RDL traces 122 form substrate terminals 128. Generally, secondary electronic component RDL traces 122 redistribute the pattern of secondary electronic component terminals 130 to the pattern of substrate terminals 128.

Substrate terminals 128 are flip chip mounted to upper traces 104 of substrate 101 by primary flip chip bumps 132. In one embodiment, primary flip chip bumps 132 are solder bumps.

In another embodiment, primary flip chip bumps 132 are copper pillars formed on substrate terminals 128 and connected to upper traces 104 by solder. By forming primary flip chip bumps 132 as copper pillars, a high standoff between primary electronic component structure 118 and substrate 101 is achieved, i.e., a sufficient distance between primary electronic component structure 118 and substrate 101 is provided to accommodate an inverted secondary electronic component 136. More particularly, by forming primary flip chip bumps 132 as copper pillars, collapse of primary flip chip bumps 132 during mounting to substrate 101 is avoided as compared to reflowing solder.

Bond pads 134 of secondary electronic component 136 are flip chip mounted to secondary electronic component terminals 130 of primary electronic component structure 118 by secondary flip chip bumps 138. The pattern of secondary electronic component terminals 130 matches the pattern of bond pads 134, e.g., a rectangular pattern just inward of the perimeter of secondary electronic component 136.

In one embodiment, secondary flip chip bumps 138 are solder bumps. In another embodiment, secondary flip chip bumps 138 are copper pillars formed on bond pads 134 and connected to secondary electronic component terminals 130 by solder. By forming secondary flip chip bumps 138 as copper pillars, a low standoff between primary electronic component structure 118 and secondary electronic component 136 is achieved, i.e., the distance between primary electronic component structure 118 and secondary electronic component 136 is minimized to enable secondary electronic component 136 to fit between primary electronic component structure 118 and substrate 101. More particularly, by forming secondary flip chip bumps 138 as copper pillars, extremely small pitch of secondary flip chip bumps 138 is achieved.

Secondary electronic component 136 includes an upper, e.g., first, surface 136U and a lower, e.g., second, surface 136L opposite upper surface 136U. Bond pads 134 of secondary electronic component 136 are formed on upper surface 136U, sometimes called an active surface.

In accordance with this embodiment, secondary electronic component 136 is a semiconductor die, sometimes called a lower semiconductor die, integrated circuit chip or an active component. However, in other embodiments, secondary electronic component 136 is another type of electronic component such as a passive component, e.g., a resistor, capacitor or inductor.

Lower surface 136L, sometimes called an inactive surface, of secondary electronic component 136 is adjacent to but spaced apart from upper surface 102U of dielectric layer 102. To accommodate placement of secondary electronic component 136 between primary electronic component structure 118 and dielectric layer 102, upper solder mask 110 is formed with a secondary electronic component opening 140.

More particularly, secondary electronic component opening 140 is slightly larger than secondary electronic component 136 in a plane parallel to lower surface 136L of secondary electronic component 136. Secondary electronic component 136 extends into and is located within secondary electronic component opening 140. A central portion 142 of upper surface 102U of dielectric layer 102 is exposed through secondary electronic component opening 140.

In another embodiment, secondary electronic component opening 140 extends into dielectric layer 102 as indicated by the dashed line 143. In accordance with this embodiment, secondary electronic component opening 140 extends entirely through upper solder mask 110 and partially into dielectric layer 102 at upper surface 102U. However, secondary electronic component opening 140 does not extend entirely through dielectric layer 102 facilitating formation of interconnection structures such as interconnection balls 116 on lower surface 102L of dielectric layer 102.

As further illustrated in FIG. 1, central portion 142 of upper surface 102U of dielectric layer 102 has an absence of upper traces 104 in accordance with this embodiment.

As the distance between a lower, e.g., first, surface 118L of primary electronic component structure 118 and upper surface 136U of secondary electronic component 136 is less than the distance between lower surface 118L and an upper, e.g., first, surface 101U of substrate 101, secondary flip chip bumps 138 are smaller than primary flip chip bumps 132 in accordance with one embodiment. However, in other embodiments, secondary flip chip bumps 138 are larger than or equal to primary flip chip bumps 132.

By placing secondary electronic component 136 between primary electronic component structure 118 and substrate 101, the height of stacked inverted flip chip package 100 is minimized.

An underfill material 144 is applied between primary electronic component structure 118 and substrate 101. Underfill material 144 fills the space between lower surface 118L of primary electronic component structure 118 and upper surface 101U of substrate 101.

Underfill material 144 encloses primary flip chip bumps 132, secondary electronic component 136, and secondary flip chip bumps 138. More particularly, underfill material 144 fills the space between upper surface 136U of secondary electronic component 136 and lower surface 118L of primary electronic component structure 118.

Further, underfill material 144 fills the space between lower surface 136L of secondary electronic component 136 and upper surface 101U of substrate 101. More particularly, underfill material 144 fills the space between lower surface 136L of secondary electronic component 136 and dielectric layer 102, e.g., upper surface 102U of dielectric layer 102.

In one embodiment, underfill material 144 is applied in the space between primary electronic component structure 118 and substrate 101 at sides 118S of primary electronic component structure 118. Underfill material 144 is pulled between primary electronic component structure 118 and substrate 101 due to capillary action and cured, if necessary. Accordingly, underfill material 144 entirely contacts lower surface 118L of primary electronic component structure 118. Illustratively, underfill material 144 is sometimes called a full capillary underfill or CUF. Stacked inverted flip chip package 100 is thus sometimes said to have a full capillary underfill (full CUF).

In accordance with this embodiment, underfill material 144 does not encloses sides 118S or an upper, e.g., second, surface 118U of primary electronic component structure 118. Instead, sides 118S and upper surface 118U, i.e., the remaining exposed surfaces, of primary electronic component structure 118 and exposed upper surface 101U of substrate 101 are enclosed in a molding compound 146, sometimes called a package body or mold cap.

Figure 2A:
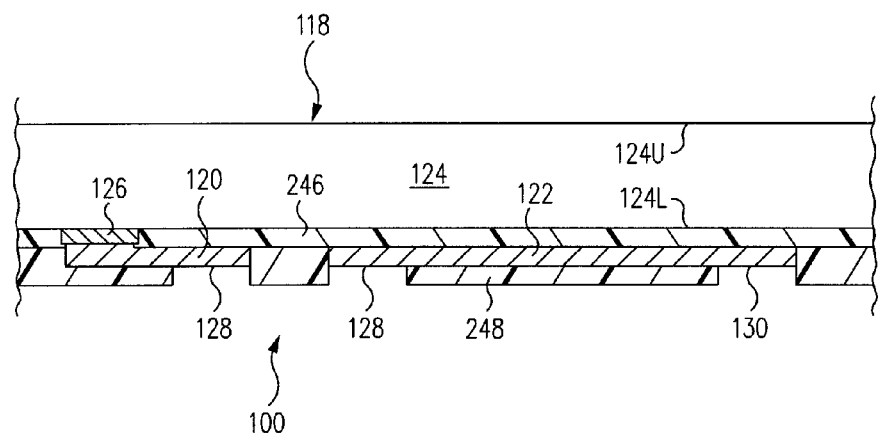
FIG. 2A is an enlarged cross-sectional view of a region II of the stacked inverted flip chip package of FIG. 1 in accordance with one embodiment.

FIG. 2A is an enlarged cross-sectional view of a region II of stacked inverted flip chip package 100 of FIG. 1 in accordance with one embodiment. As illustrated in FIG. 2A, primary electronic component structure 118 includes primary electronic component 124. Primary electronic component 124 includes bond pads 126. A patterned passivation layer 246 is formed on lower surface 124L of primary electronic component 124. Patterned passivation layer 246 is patterned to expose bond pads 126.

In accordance with this embodiment, primary electronic component RDL traces 120 are formed on patterned passivation layer 246 and are electrically connected to bond pads 126 of primary electronic component 124 through openings in patterned passivation layer 246. Secondary electronic component RDL traces 122 are also formed on patterned passivation layer 246.

A patterned dielectric layer 248 is formed on patterned passivation layer 246, primary electronic component RDL traces 120 and secondary electronic component RDL traces 122. Patterned dielectric layer 248 is patterned to expose portions of primary electronic component RDL traces 120 and secondary electronic component RDL traces 122. More particularly, patterned dielectric layer 248 exposes substrate terminals 128 of primary electronic component RDL traces 120 and secondary electronic component RDL traces 122.

Further, patterned dielectric layer 248 exposes secondary electronic component terminals 130 of secondary electronic component RDL traces 122.

The embodiment illustrated in FIG. 2A illustrate an example of primary electronic component structure 118 when patterned passivation layer 246 of primary electronic component 124 has sufficient integrity, e.g., thickness, to allow primary electronic component RDL traces 120 and secondary electronic component RDL traces 122 to be formed thereon.

In one embodiment, primary electronic component 124 is an integrated circuit die designed for flip chip mounting and thus patterned passivation layer 246 is formed with a sufficient integrity to withstand the flip chip mounting process. In this example, patterned passivation layer 246 has sufficient integrity, e.g., thickness, to allow primary electronic component RDL traces 120 and secondary electronic component RDL traces 122 to be directly formed thereon. However, in another embodiment, patterned passivation layer 246 does not have a sufficient integrity to allow primary electronic component RDL traces 120 and secondary electronic component RDL traces 122 to be formed directly thereon. Such an example is set forth below in reference to FIG. 2B.

Figure 2B:
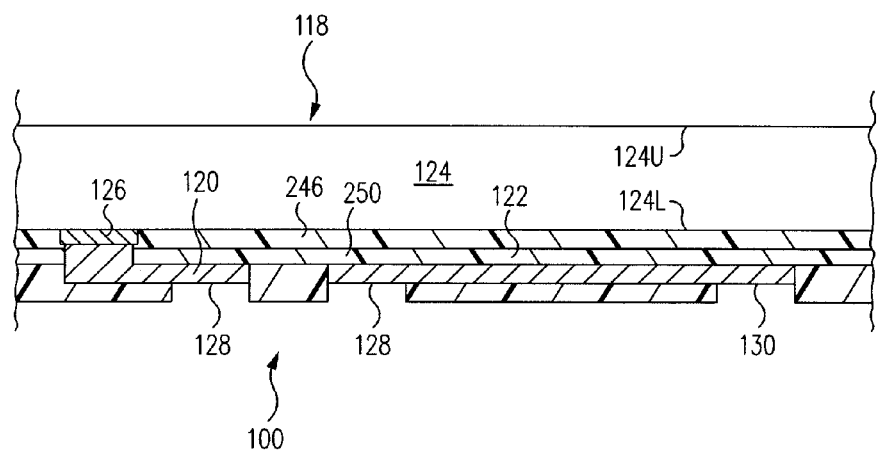
FIG. 2B is an enlarged cross-sectional view of a region II of the stacked inverted flip chip package of FIG. 1 in accordance with another embodiment.

FIG. 2B is an enlarged cross-sectional view of a region II of stacked inverted flip chip package 100 of FIG. 1 in accordance with another embodiment. Stacked inverted flip chip package 100 of FIG. 2B is substantially similar to stacked inverted flip chip package 100 of FIG. 2A and only the significant differences are discussed below.

Referring now to FIG. 2B, a patterned passivation buildup layer 250, sometimes called a dielectric layer, is formed on patterned passivation layer 246. Patterned passivation buildup layer 250 essentially builds up, i.e., increases in thickness, patterned passivation layer 246. Patterned passivation buildup layer 250 is patterned to expose bond pads 126 in a manner similar to patterned passivation layer 246.

For example, primary electronic component 124 is an integrated circuit die designed for wire bonding. Thus, patterned passivation layer 246 is formed with an insufficient integrity to allow primary electronic component RDL traces 120 and secondary electronic component RDL traces 122 to be formed directly thereon. However, patterned passivation buildup layer 250 is formed to build up patterned passivation layer 246 such that patterned passivation layer 246 and patterned passivation buildup layer 250 collectively have a sufficient integrity to allow primary electronic component RDL traces 120 and secondary electronic component RDL traces 122 to be formed thereon.

Accordingly, primary electronic component RDL traces 120 and secondary electronic component RDL traces 122 are formed on patterned passivation buildup layer 250. Patterned dielectric layer 248 is formed on patterned passivation buildup layer 250, primary electronic component RDL traces 120 and secondary electronic component RDL traces 122 in a manner similar to that discussed above regarding the embodiment illustrated in FIG. 2A.

Figure 3:
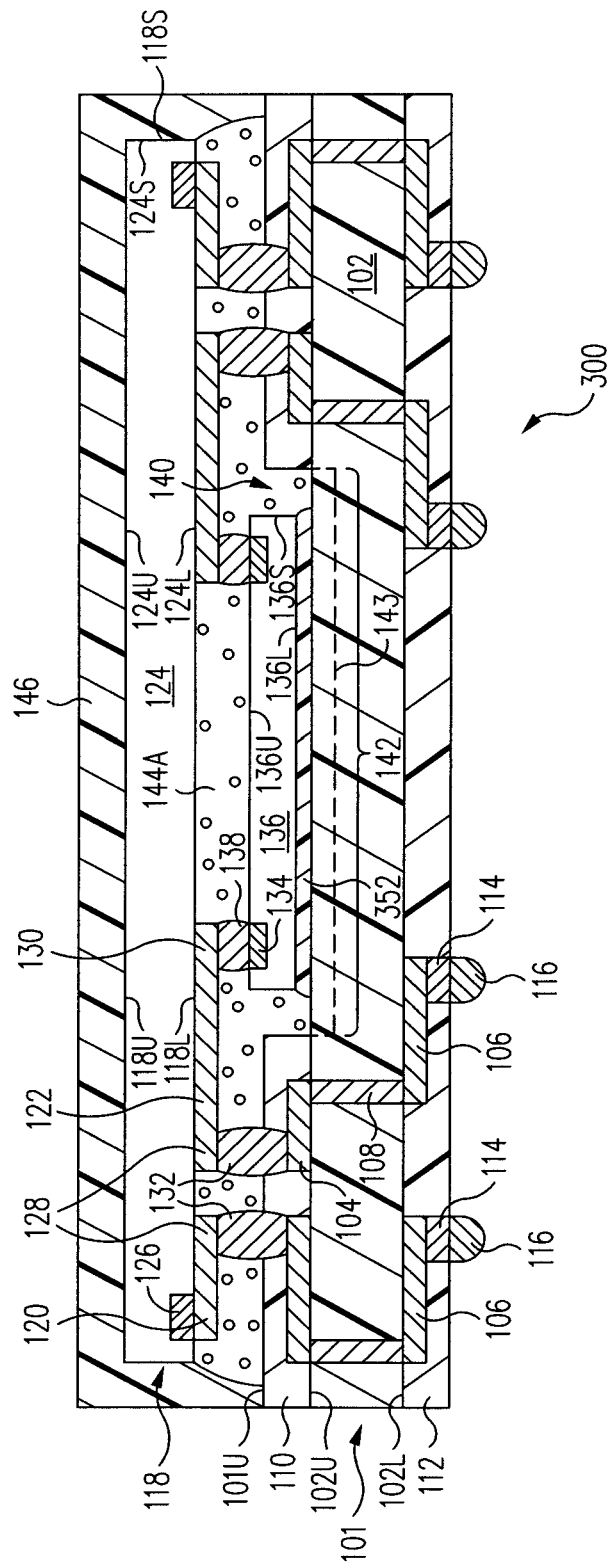
FIGS. 3, 4, 5, 6, 7, and 8 are cross-sectional views of stacked inverted flip chip packages in accordance with various embodiments.

FIG. 3 is a cross-sectional view of a stacked inverted flip chip package 300 in accordance with another embodiment. Stacked inverted flip chip package 300 of FIG. 3 is substantially similar to stacked inverted flip chip package 100 of FIG. 1. Only the significant differences between stacked inverted flip chip package 300 and stacked inverted flip chip package 100 are discussed below.

Referring now to FIG. 3, in accordance with this embodiment, a nonconductive paste (NCP) 352 fills the space between secondary electronic component 136 and substrate 101. More particularly, nonconductive paste 352 fills the space between lower surface 136L of secondary electronic component 136 and dielectric layer 102. In one embodiment, nonconductive paste 352 is applied as a viscous paste, and cured if necessary. For example, nonconductive paste 352 cures during flip chip attachment of primary electronic component structure 118 to substrate 101. In accordance with this embodiment, nonconductive paste 352 bonds secondary electronic component 136 to substrate 101.

An underfill material 144A fills the space between lower surface 118L of primary electronic component structure 118 and upper surface 101U of substrate 101.

Underfill material 144A encloses primary flip chip bumps 132, secondary electronic component 136, secondary flip chip bumps 138, and nonconductive paste 352. More particularly, underfill material 144A fills the space between upper surface 136U of secondary electronic component 136 and lower surface 118L of primary electronic component structure 118.

In one embodiment, underfill material 144A is applied in the space between primary electronic component structure 118 and substrate 101 at sides 118S of primary electronic component structure 118. Underfill material 144A is pulled between primary electronic component structure 118 and substrate 101 due to capillary action and cured, if necessary. Accordingly, underfill material 144A entirely contacts lower surface 118L of primary electronic component structure 118. Stacked inverted flip chip package 300 is thus sometimes said to have a full capillary underfill (full CUF) with nonconductive paste (NCP).

Figure 4:
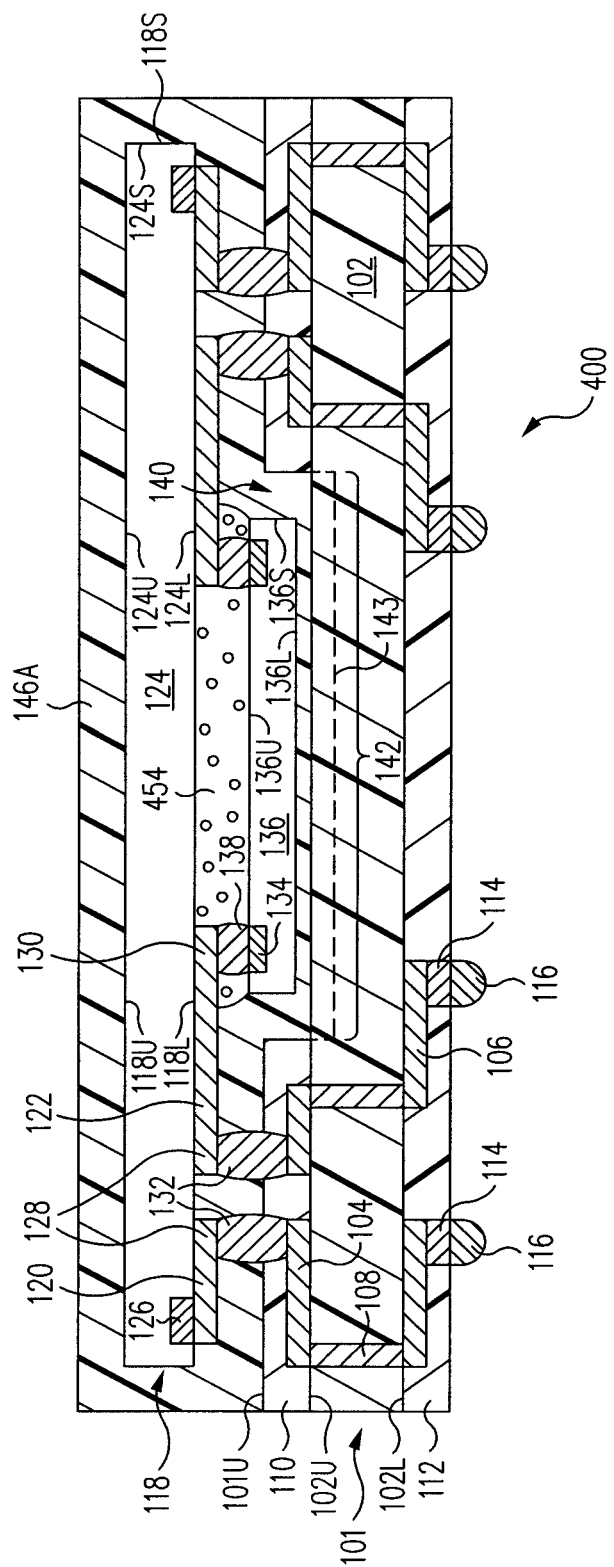

FIG. 4 is a cross-sectional view of a stacked inverted flip chip package 400 in accordance with another embodiment. Stacked inverted flip chip package 400 of FIG. 4 is substantially similar to stacked inverted flip chip package 100 of FIG. 1. Only the significant differences between stacked inverted flip chip package 400 and stacked inverted flip chip package 100 are discussed below.

Referring now to FIG. 4, in accordance with this embodiment, an underfill material 454 fills the space between primary electronic component structure 118 and secondary electronic component 136. More particularly, underfill material 454 fills the space between lower surface 118L of primary electronic component structure 118 and upper surface 136U of secondary electronic component 136. Underfill material 454 encloses secondary flip chip bumps 138.

In one embodiment, underfill material 454 is applied as a viscous liquid in the space between primary electronic component structure 118 and secondary electronic component 136 at sides 136S of secondary electronic component 136. Underfill material 454 is pulled between primary electronic component structure 118 and secondary electronic component 136 due to capillary action and cured, if necessary. Accordingly, underfill material 454 entirely contacts upper surface 136U of secondary electronic component 136.

A molding compound 146A, sometimes called a molded underfill or MUF, is applied, e.g., by molding, to enclose primary electronic component structure 118 and exposed upper surface 101U of substrate 101. Molding compound 146A encloses upper surface 118U and sides 118S of primary electronic component structure 118. Further, molding compound 146A fills the space between lower surface 118L of primary electronic component structure 118 and upper surface 101U of substrate 101. Molding compound 146A encloses primary flip chip bumps 132, secondary electronic component 136, underfill material 454 and exposed upper surface 101U of substrate 101.

Further, molding compound 146A fills the space between secondary electronic component 136 and upper surface 101U of substrate 101. More particularly, molding compound 146A fills the space between lower surface 136L of secondary electronic component 136 and dielectric layer 102, e.g., upper surface 102U of dielectric layer 102. Stacked inverted flip chip package 400 is thus sometimes said to have a partial capillary underfill (partial CUF) plus molded underfill (MUF).

Figure 5:
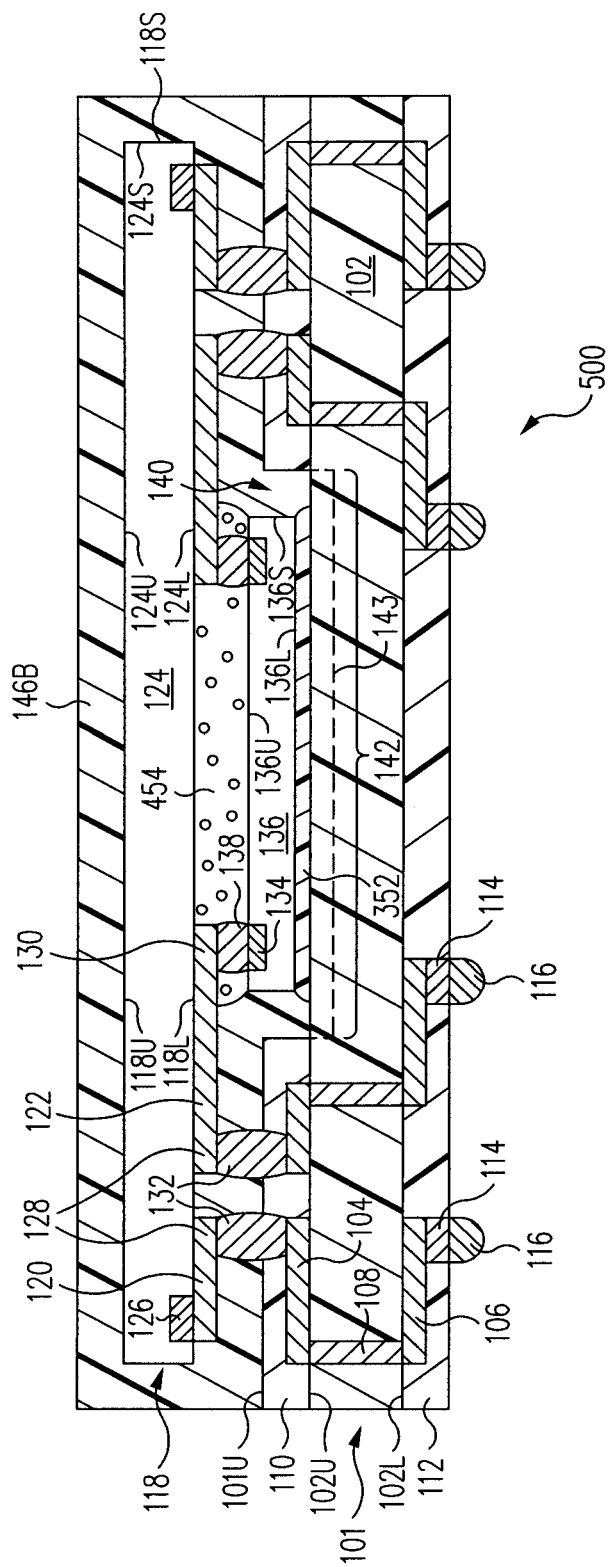

FIG. 5 is a cross-sectional view of a stacked inverted flip chip package 500 in accordance with another embodiment. Stacked inverted flip chip package 500 of FIG. 5 is substantially similar to stacked inverted flip chip package 100 of FIG. 1. Only the significant differences between stacked inverted flip chip package 500 and stacked inverted flip chip package 100 are discussed below.

Referring now to FIG. 5, in accordance with this embodiment, underfill material 454 fills the space between primary electronic component structure 118 and secondary electronic component 136 in a manner similar to that discussed above regarding stacked inverted flip chip package 400 of FIG. 4 and so is not repeated here.

Further, nonconductive paste 352 fills the space between secondary electronic component 136 and substrate 101 in a manner similar to that discussed above regarding stacked inverted flip chip package 300 of FIG. 3 and so is not repeated here.

A molding compound 146B is applied, e.g., by molding, to enclose primary electronic component structure 118. Molding compound 146B encloses upper surface 118U and sides 118S of primary electronic component structure 118. Further, molding compound 146B fills the space between lower surface 118L of primary electronic component structure 118 and upper surface 101U of substrate 101. Molding compound 146B encloses primary flip chip bumps 132, secondary electronic component 136, underfill material 454, and nonconductive paste 352. Stacked inverted flip chip package 500 is thus sometimes said to have a partial capillary underfill (partial CUF) plus a molded underfill (MUF) plus nonconductive paste (NCP).

Figure 6:
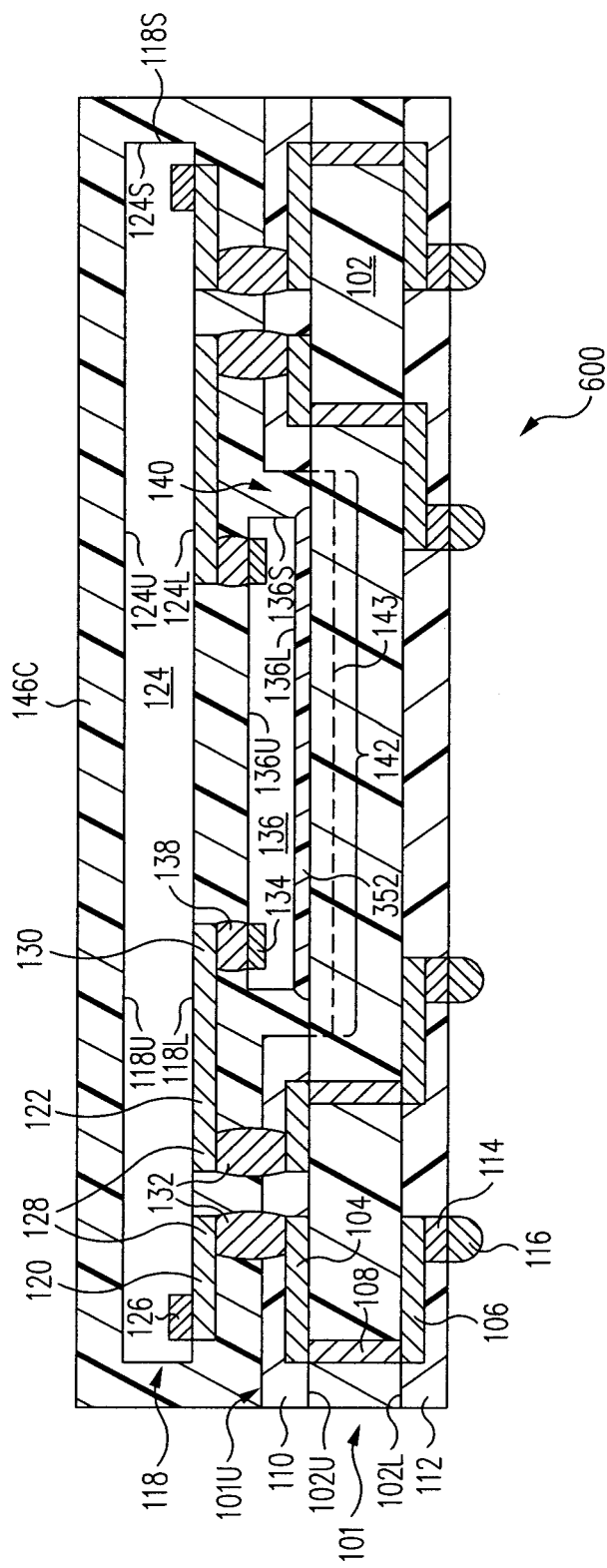

FIG. 6 is a cross-sectional view of a stacked inverted flip chip package 600 in accordance with another embodiment. Stacked inverted flip chip package 600 of FIG. 6 is substantially similar to stacked inverted flip chip package 100 of FIG. 1. Only the significant differences between stacked inverted flip chip package 600 and stacked inverted flip chip package 100 are discussed below.

Referring now to FIG. 6, in accordance with this embodiment, nonconductive paste 352 fills the space between secondary electronic component 136 and substrate 101 in a manner similar to that discussed above regarding stacked inverted flip chip package 300 of FIG. 3 and so is not repeated here.

A molding compound 146C is applied, e.g., by molding, to enclose primary electronic component structure 118. Molding compound 146C encloses upper surface 118U and sides 118S of primary electronic component structure 118. Further, molding compound 146C fills the space between lower surface 118L of primary electronic component structure 118 and upper surface 101U of substrate 101.

Molding compound 146C encloses primary flip chip bumps 132, secondary electronic component 136, secondary flip chip bumps 138, and nonconductive paste 352. More particularly, molding compound 146C fills the space between upper surface 136U of secondary electronic component 136 and lower surface 118L of primary electronic component structure 118. Stacked inverted flip chip package 600 is thus sometimes said to have a nonconductive paste (NCP) plus molded underfill (MUF).

Figure 7:
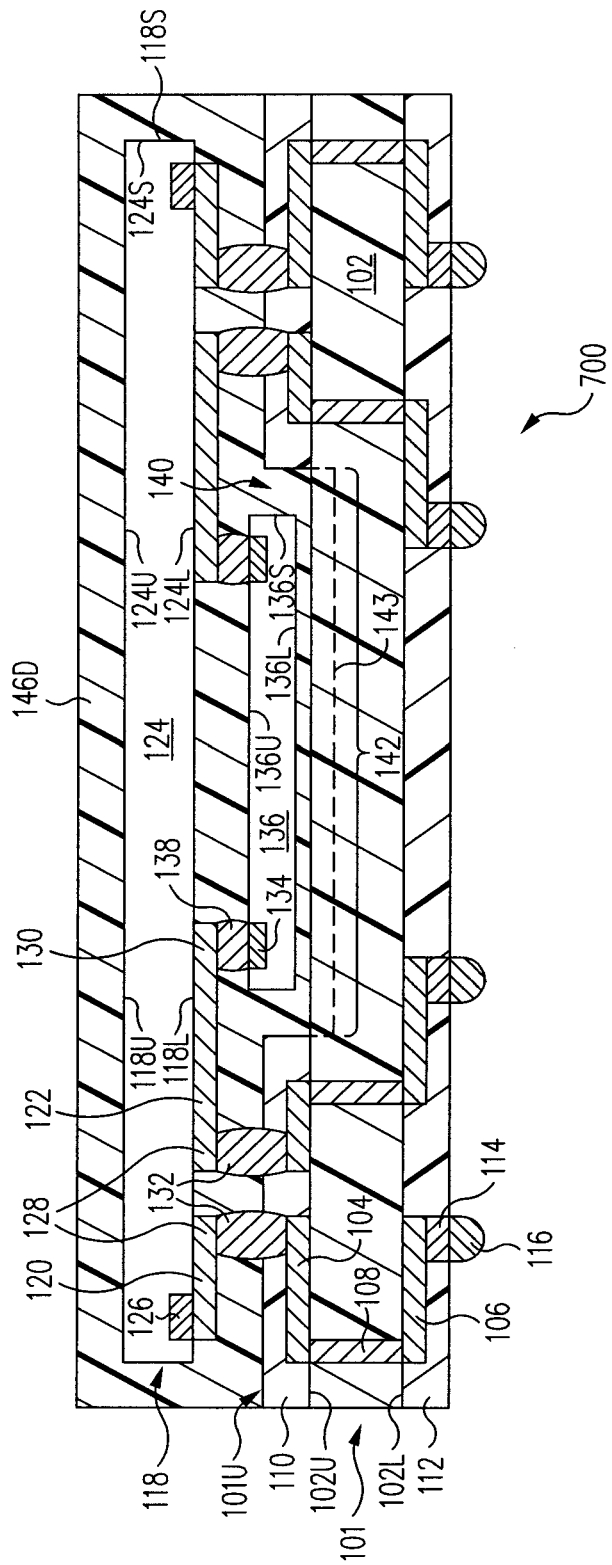

FIG. 7 is a cross-sectional view of a stacked inverted flip chip package 700 in accordance with another embodiment.

Stacked inverted flip chip package 700 of FIG. 7 is substantially similar to stacked inverted flip chip package 100 of FIG. 1. Only the significant differences between stacked inverted flip chip package 700 and stacked inverted flip chip package 100 are discussed below.

Referring now to FIG. 7, in accordance with this embodiment, a molding compound 146D is applied, e.g., by molding, to enclose primary electronic component structure 118. Molding compound 146D encloses upper surface 118U and sides 118S of primary electronic component structure 118. Further, molding compound 146D fills the space between lower surface 118L of primary electronic component structure 118 and upper surface 101U of substrate 101.

Molding compound 146D encloses primary flip chip bumps 132, secondary electronic component 136, and secondary flip chip bumps 138. More particularly, molding compound 146D fills the space between upper surface 136U of secondary electronic component 136 and lower surface 118L of primary electronic component structure 118.

Further, molding compound 146D fills the space between secondary electronic component 136 and substrate 101. More particularly, molding compound 146D fills the space between lower surface 136L of secondary electronic component 136 and dielectric layer 102. Stacked inverted flip chip package 700 is thus sometimes said to have a full molded underfill (full MUF).

Figure 8:
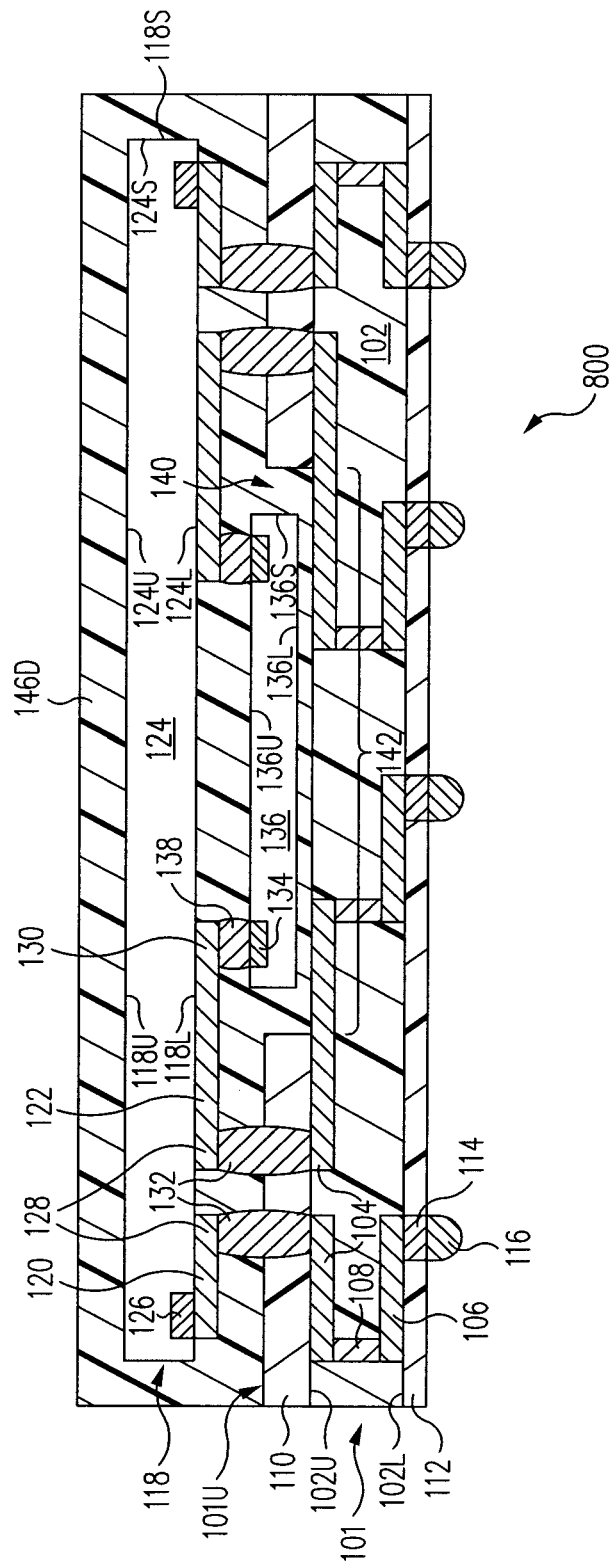

FIG. 8 is a cross-sectional view of a stacked inverted flip chip package 800 in accordance with another embodiment. Stacked inverted flip chip package 800 of FIG. 8 is substantially similar to stacked inverted flip chip package 700 of FIG. 7. Only the significant differences between stacked inverted flip chip package 800 and stacked inverted flip chip package 700 are discussed below.

Referring now to FIG. 8, in accordance with this embodiment, upper traces 104 and lower traces 106 are embedded within dielectric layer 102. More particularly, upper traces 104 are embedded within dielectric layer 102 at upper surface 102U such that upper traces 104 do not protrude above upper surface 102U. Similarly, lower traces 106 are embedded within dielectric layer 102 at lower surface 102L such that lower traces 106 do not protrude below lower surface 102L.

In accordance with this embodiment, upper traces 104 are formed within central portion 142 of upper surface 102U of dielectric layer 102. More particularly, upper traces 104 are formed directly below secondary electronic component 136.

In accordance with one embodiment, referring again to FIG. 1, a method of forming stacked inverted flip chip package 100 includes formation of primary electronic component structure 118 having substrate terminals 128 and secondary electronic component terminals 130 as discussed above. Secondary electronic component 136 is physically and electrically connected to secondary electronic component terminals 130 by secondary flip chip bumps 138.

Optionally, underfill material 454 is applied between secondary electronic component 136 and primary electronic component structure 118 is illustrated FIG. 4. Optionally, a nonconductive paste 352 is applied to lower surface 136L of secondary electronic component 136 as illustrated in FIG. 3.

Referring again to FIG. 1, substrate terminals 128 of primary electronic component structure 118 are physically and electrically connected to upper traces 104 by primary flip chip bumps 132. Optionally, underfill material 144 is applied to underfill primary electronic component structure 118. Molding compounds 146 (FIGS. 1, 3), 146A (FIG. 4), 146B (FIG. 5), 146C (FIG. 6), or 146D (FIGS. 7, 8) are applied to enclose the various structures set forth above.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A stacked inverted flip chip package comprising:
   a substrate comprising:
      a secondary electronic component opening;
      first traces;
      a dielectric layer, the first traces being embedded within a first surface of the dielectric layer; and
      a first solder mask coupled to the first surface of the dielectric layer, the secondary electronic component opening being formed within the first solder mask only, a central portion of the first surface of the dielectric layer being exposed through the secondary electronic component opening;
   a primary electronic component structure comprising:
      substrate terminals; and
      secondary electronic component terminals;
   primary flip chip bumps electrically and physically coupling the substrate terminals to the first traces;
   a secondary electronic component comprising bond pads, the secondary electronic component extending into the secondary electronic component opening, the first traces extending within a plane along the first surface of the dielectric layer laterally from outside the central portion to within the central portion directly below the secondary electronic component; and
   secondary flip chip bumps electrically and physically coupling the bond pads to the secondary electronic component terminals, wherein a distance between the primary electronic component structure and the secondary electronic component is less than a distance between the primary electronic component structure and the substrate.

2. A stacked inverted flip chip package comprising:
   a substrate comprising:
      a secondary electronic component opening; and
      first traces;
   a primary electronic component structure comprising:
      substrate terminals; and
      secondary electronic component terminals;
   primary flip chip bumps electrically and physically coupling the substrate terminals to the first traces;
   a secondary electronic component comprising bond pads, the secondary electronic component extending into the secondary electronic component opening;
   secondary flip chip bumps electrically and physically coupling the bond pads to the secondary electronic component terminals, wherein a distance between the primary electronic component structure and the secondary electronic component is less than a distance between the primary electronic component structure and the substrate;
   a nonconductive paste filling a space between the secondary electronic component and the substrate;
   a capillary underfill material filling a space between a first surface of the primary electronic component structure and the substrate, between the secondary electronic component and the first surface of the primary electronic component structure, and enclosing the nonconductive paste, a second surface and sides of the primary electronic component structure being completely exposed from the capillary underfill material, wherein the capillary underfill material contacts the entire first surface of the primary electronic component structure; and a molding compound enclosing the second surface and the entire sides of the primary electronic component structure and the capillary underfill material, wherein the substrate further comprises:

a dielectric layer, the first traces being coupled to a first surface of the dielectric layer; and a first solder mask coupled to the first surface of the dielectric layer, the secondary electronic component opening being formed within the first solder mask, a central portion of the first surface of the dielectric layer being exposed through the secondary electronic component opening.

3. The stacked inverted flip chip package of claim 2 wherein the secondary electronic component opening extends entirely through the first solder mask and partially into the dielectric layer.

4. The stacked inverted flip chip package of claim 2 wherein the central portion of the first surface of the dielectric layer has an absence of the first traces.

5. The stacked inverted flip chip package of claim 2 wherein the substrate further comprises:

second traces on a second surface of the dielectric layer; and vias electrically coupling the second traces to the first traces.

6. The stacked inverted flip chip package of claim 1 wherein the primary flip chip bumps comprise solder bumps.

7. The stacked inverted flip chip package of claim 1 wherein the primary flip chip bumps comprise copper pillars.

8. The stacked inverted flip chip package of claim 1 wherein the secondary flip chip bumps comprise solder bumps.

9. The stacked inverted flip chip package of claim 1 wherein the secondary flip chip bumps comprise copper pillars.

10. The stacked inverted flip chip package of claim 1 further comprising a nonconductive paste filling a space between the secondary electronic component and the substrate.

11. The stacked inverted flip chip package of claim 1 further comprising an underfill material filling a space between the primary electronic component structure and the secondary electronic component.

12. The stacked inverted flip chip package of claim 1 wherein the primary electronic component structure further comprises:

a primary electronic component comprising a first surface comprising bond pads thereon;

a patterned passivation layer on the first surface of the primary electronic component, the patterned passivation layer exposing the bond pads;

primary electronic component redistribution layer (RDL) traces on the patterned passivation layer, the primary electronic component RDL traces being electrically connected to the bond pads;

secondary electronic component RDL traces on the patterned passivation layer;

a patterned dielectric layer formed on the patterned passivation layer, the primary electronic component RDL traces, and the secondary electronic component RDL traces, wherein the patterned dielectric layer exposes the substrate terminals of the primary electronic component RDL traces and the secondary electronic component RDL traces and the secondary electronic component terminals of the secondary electronic component RDL traces, wherein the secondary flip chip bumps are smaller than the primary flip chip bumps.

13. The stacked inverted flip chip package of claim 12 wherein the primary electronic component structure further comprises a patterned passivation buildup layer on the patterned passivation layer.

* * * * *